(12) United States Patent
Chen et al.

(10) Patent No.: US 9,159,808 B2
(45) Date of Patent: Oct. 13, 2015

(54) SELECTIVE ETCH-BACK PROCESS FOR SEMICONDUCTOR DEVICES

(75) Inventors: Neng-Kuo Chen, Sinshih Township (TW); Kuo-Hwa Tzeng, Taipei (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 426 days.

(21) Appl. No.: 12/617,463

(22) Filed: Nov. 12, 2009

(65) Prior Publication Data

US 2010/0190345 A1    Jul. 29, 2010

Related U.S. Application Data

(60) Provisional application No. 61/147,164, filed on Jan. 26, 2009.

(51) Int. Cl.
| | | |
|---|---|---|
| H01L 21/311 | (2006.01) | |
| H01L 29/66 | (2006.01) | |
| H01L 21/762 | (2006.01) | |
| H01L 21/336 | (2006.01) | |
| H01L 29/78 | (2006.01) | |

(52) U.S. Cl.
 CPC .... *H01L 29/66795* (2013.01); *H01L 21/31116* (2013.01); *H01L 21/76232* (2013.01); *H01L 29/7854* (2013.01)

(58) Field of Classification Search
 CPC ...................... H01L 29/7813; H01L 29/66734; H01L 21/31116; H01L 21/31144
 USPC .................................................. 438/700, 270
 See application file for complete search history.

(56) References Cited

U.S. PATENT DOCUMENTS

| | | | | |
|---|---|---|---|---|
| 5,350,492 | A  * | 9/1994 | Hall et al. | 438/694 |
| 6,074,954 | A  * | 6/2000 | Lill et al. | 438/710 |
| 6,171,974 | B1 * | 1/2001 | Marks et al. | 438/740 |
| 6,265,269 | B1 * | 7/2001 | Chen et al. | 438/270 |
| 6,706,571 | B1 | 3/2004 | Yu et al. | |
| 6,794,268 | B2 * | 9/2004 | Karpov et al. | 438/427 |
| 6,858,478 | B2 | 2/2005 | Chau et al. | |
| 7,190,050 | B2 | 3/2007 | King et al. | |
| 7,247,887 | B2 | 7/2007 | King et al. | |
| 7,265,008 | B2 | 9/2007 | King et al. | |
| 7,411,268 | B2 * | 8/2008 | Karpov et al. | 257/510 |
| 7,508,031 | B2 | 3/2009 | Liu et al. | |
| 7,528,465 | B2 | 5/2009 | King et al. | |
| 7,605,449 | B2 | 10/2009 | Liu et al. | |

(Continued)

FOREIGN PATENT DOCUMENTS

EP    1 944 796 A2    7/2008

*Primary Examiner* — Robert Huber
*Assistant Examiner* — Eric Jones
(74) *Attorney, Agent, or Firm* — Slater & Matsil, L.L.P.

(57) ABSTRACT

A semiconductor device having fins and a method of manufacture are provided. A patterned mask is formed over a substrate. Trenches are formed in the substrate and the trenches are filled with a dielectric material. Thereafter, the patterned mask is removed and one or more etch processes are performed to recess the dielectric material, wherein at least one of the etch processes is an etch process that removes or prevents fences from being formed along sidewalls of the trench. The etch process may be, for example, a plasma etch process using $NH_3$ and $NF_3$, an etch process using a polymer-rich gas, or an $H_2$ etch process.

20 Claims, 3 Drawing Sheets

(56) References Cited

U.S. PATENT DOCUMENTS

| | | | |
|---|---|---|---|
| 8,455,942 B2* | 6/2013 | Park | 257/330 |
| 2004/0132234 A1* | 7/2004 | Ko et al. | 438/152 |
| 2004/0248414 A1* | 12/2004 | Tsai et al. | 438/689 |
| 2004/0262660 A1* | 12/2004 | Huang | 257/301 |
| 2005/0153490 A1 | 7/2005 | Yoon et al. | |
| 2005/0186746 A1* | 8/2005 | Lee et al. | 438/300 |
| 2005/0266647 A1* | 12/2005 | Kim et al. | 438/296 |
| 2006/0088967 A1* | 4/2006 | Hsiao et al. | 438/296 |
| 2006/0192245 A1* | 8/2006 | Oosawa | 257/315 |
| 2007/0018276 A1* | 1/2007 | Itou | 257/506 |
| 2007/0026629 A1* | 2/2007 | Chen et al. | 438/424 |
| 2007/0087499 A1* | 4/2007 | Seo et al. | 438/243 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0158756 A1* | 7/2007 | Dreeskornfeld et al. | 257/374 |
| 2007/0238295 A1* | 10/2007 | Alapati et al. | 438/689 |
| 2007/0246779 A1* | 10/2007 | Chun et al. | 257/365 |
| 2008/0081420 A1* | 4/2008 | Kim | 438/268 |
| 2008/0105915 A1* | 5/2008 | Park et al. | 257/314 |
| 2008/0182382 A1* | 7/2008 | Ingle et al. | 438/435 |
| 2008/0290470 A1 | 11/2008 | King et al. | |
| 2008/0296632 A1 | 12/2008 | Moroz et al. | |
| 2009/0181477 A1 | 7/2009 | King et al. | |

* cited by examiner

SELECTIVE ETCH-BACK PROCESS FOR SEMICONDUCTOR DEVICES

This application claims priority to U.S. Provisional Patent Application Ser. No. 61/147,164, filed Jan. 26, 2009, and entitled "Selective Etch-Back Process for Semiconductor Devices," which application is hereby incorporated herein by reference.

TECHNICAL FIELD

The present invention relates to the field of semiconductor devices, and more specifically, to the formation of improved isolation structures with nitrogen-containing liners.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the N2x nm regime, approaches involving the use of fin field-effect transistors (finFETs) are being investigated to improve the short channel effects.

Generally, fins are produced by etching a trench in a silicon substrate. A liner of in-situ steam generation (ISSG) oxide is formed along the sidewalls of the trench, and then the trench is filled by a high-density plasma (HDP) oxide or a high-aspect-ratio process (HARP) oxide. An etch-back process is typically performed to recess the oxide within the trench, thereby forming the fins. During the etch-back process, however, oxide fences are often formed along sidewalls of the trench due to the differences in the etch rate between the liner oxide and the HDP/HARP oxide. The oxide fences may result in a thinner gate oxide or bottom oxide and may adversely impact the gate leakage performance of the finFETs.

As a result, a structure of and method for forming semiconductor devices having fins with no or reduced oxide fences are needed.

SUMMARY OF THE INVENTION

These and other problems are generally solved or circumvented, and technical advantages are generally achieved, by preferred embodiments of the present invention which provides semiconductor devices having semiconductor fins without fences along the sidewalls.

In accordance with an embodiment of the present invention, a method of forming a semiconductor device is provided. A substrate is provided and one or more fins are formed in the substrate. An area between adjacent ones of the fins is filled with a dielectric material. Thereafter, the dielectric material is recessed without forming fences along sidewalls of the fins. The dielectric material may be recessed using, for example, one or more etch processes, including a plasma etch process using $NH_3$ and $NF_3$, a poly-rich gas etch process, or an $H_2$ etch process.

In accordance with another embodiment of the present invention, a method of forming a semiconductor device is provided. A substrate is provided and one or more trenches are formed therein. The trenches are at least partially filled with a dielectric material, and then the dielectric material is recessed such that fences remain along sidewalls of the trenches. Thereafter, the fences are removed. The fences may be removed using, for example, one or more etch processes, including a plasma etch process using $NH_3$ and $NF_3$, a poly-rich gas etch process, or an $H_2$ etch process.

In accordance with yet another embodiment of the present invention, another method of forming a semiconductor device is provided. A substrate is provided having a trench formed therein. The trench is filled with a dielectric material and a first etch process is performed to recess a top surface of the dielectric material below a top surface of the substrate. A second etch process is used to remove dielectric material along sidewalls of the trench. The second etch process may include, for example, one or more etch processes, including a plasma etch process using $NH_3$ and $NF_3$, a poly-rich gas etch process, or an $H_2$ etch process.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
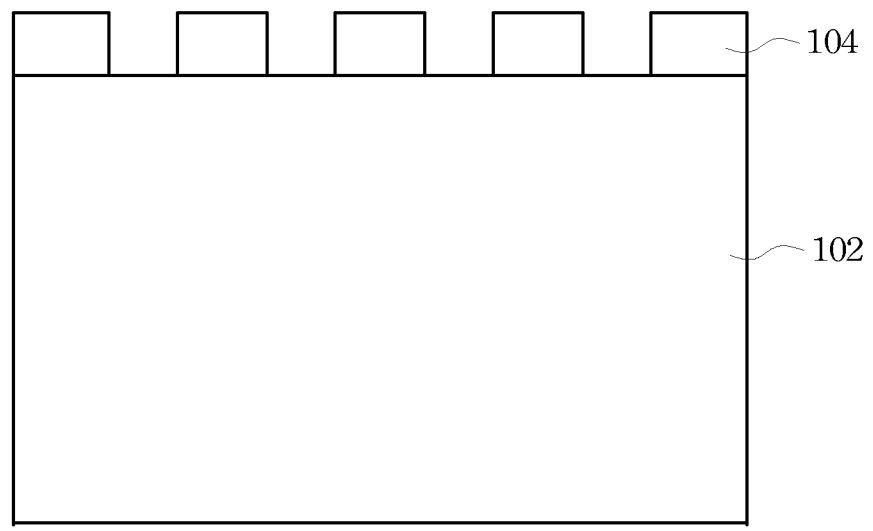
FIGS. 1-5 illustrate a method of forming fins in accordance with an embodiment of the present invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing an isolation structure in accordance with an embodiment of the present invention are illustrated in FIGS. 1-5. Embodiments of the present invention may be particularly useful in creating semiconductor (e.g., silicon) fins of the type that may be used, for example, finFETs. Other embodiments of the present invention, however, may be used in other types of devices. Throughout the various views and illustrative embodiments of the present invention, like reference numerals are used to designate like elements.

Referring first to FIG. 1, a semiconductor substrate 102 having a patterned mask 104 formed thereon is shown in accordance with an embodiment of the present invention. The semiconductor substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The patterned mask 104 defines a pattern of isolation trenches to be formed in subsequent processing steps. The patterned mask 104 may comprise a hard mask of one or more dielectric layers. For example, the hard mask may be a layer of a silicon dioxide or a silicon nitride formed by, for example, thermal oxidation, chemical vapor deposition (CVD), or the like. Alternatively, the hard mask may be formed of other dielectric materials, such as silicon oxynitride. A multi-layer hard mask, such as layers of silicon dioxide and silicon nitride, may also be used. Furthermore, other materials, such as a metal, a metal nitride, a metal oxide, or the like may be used. For example, the hard mask may be formed of tungsten.

As illustrated in FIG. 1, the patterned mask 104 is subsequently patterned using, for example, photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 104 to define the pattern of isolation trenches.

Figure 2:
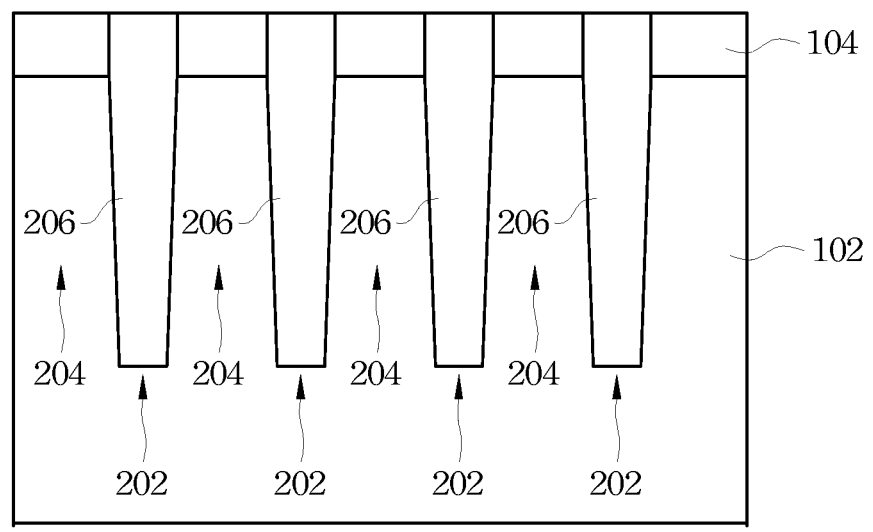

FIG. 2 illustrates formation of trenches 202 in the semiconductor substrate 102 in accordance with an embodiment of the present invention. Exposed portions of the semiconductor substrate 102 may be etched to form the trenches 202 in the semiconductor substrate 102 as illustrated in FIG. 2. The semiconductor substrate 102 may be etched by, for example, $HBr/O_2$, $HBr/Cl_2/O_2$, or $SF_6/Cl_2$ plasma. As will be discussed in greater detail below, the regions of the semiconductor substrate 102 between adjacent trenches 202 form fins 204. In an embodiment, trenches 202 have a depth from about 500 Å to about 10,000 Å.

The trenches 202 are filled with a dielectric material forming isolation regions 206 in accordance with an embodiment of the present invention. The trenches 202 may be filled by forming a dielectric layer over the patterned mask 104 and substantially filling the trenches 202. In an embodiment, the dielectric layer comprises a silicon dioxide layer that may be formed by first forming a layer of ISSG oxide along the sidewalls followed by forming a HDP oxide using a CVD deposition process with a $SiH_4$ and $O_2$ mixture. In an embodiment, the dielectric layer is about 500 Å to about 100,000 Å in thickness.

Thereafter, a planarization process is performed to remove excess material. The dielectric layer may be planarized, for example, by using a chemical-mechanical polishing (CMP) process using an oxide slurry wherein the patterned mask 104 acts as a stop layer.

Figure 3:
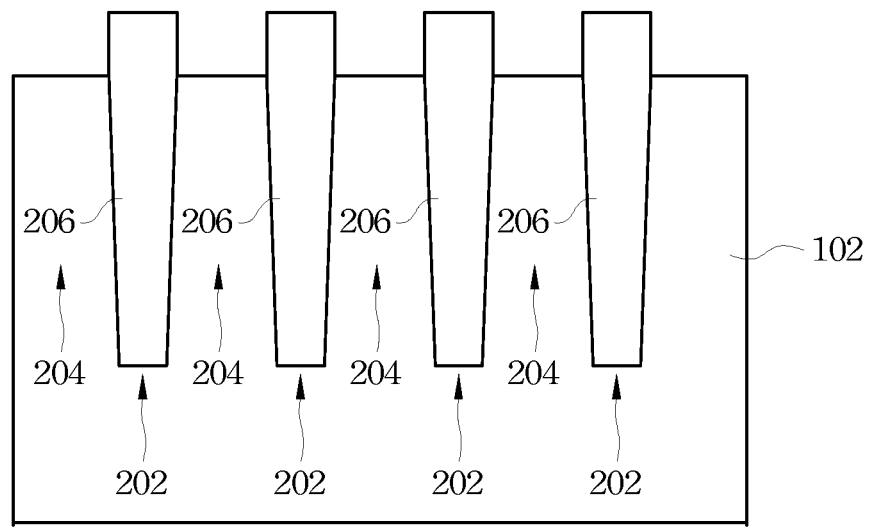

FIG. 3 illustrates the removal of the patterned mask 104 (see FIG. 2) in accordance with an embodiment of the present invention. The patterned mask 104 may be removed using, for example, a wet dip in a solution of phosphoric acid.

Figure 4:
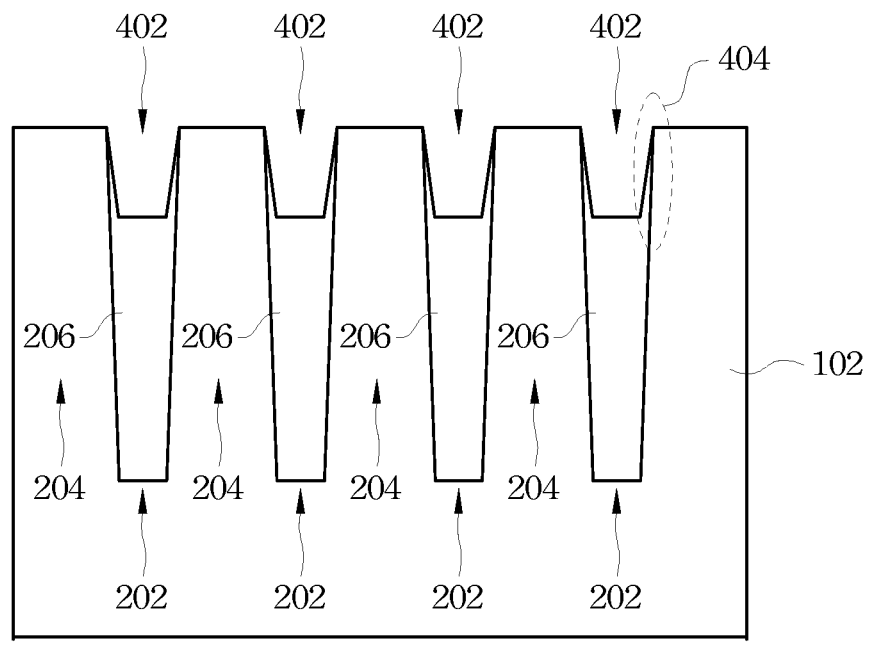

FIG. 4 illustrates a first etch-back process to form recesses 402 in the dielectric material of the isolation regions 206 in accordance with an embodiment of the present invention. As noted above, the portions of the semiconductor substrate 102 positioned between the trenches 202 are fins 204 of a finFET. As such, the dielectric material within the trenches 202 is recessed, thereby exposing the sidewalls of the fins 204. In an embodiment in which the dielectric material is silicon dioxide, the recessing may be performed at least in part by a wet etch process using a dilute hydrofluoric acid.

As illustrated in FIG. 4, the etch rate of the silicon dioxide formed along the sidewalls of the trench 202 is different than the etch rate of the silicon dioxide formed in the center of the trench 202. This difference in the etch rate is due at least in part to the methods used to form the silicon dioxide. As discussed above, the silicon dioxide is usually formed by first forming an ISSG oxide along the sidewalls and then forming an HDP/HARP oxide over the ISSG oxide. As a result of the different methods of forming the silicon oxide layer, the HDP/HARP oxide etches at a faster rate than the ISSG oxide, thereby causing the center portion of the isolation regions 206 to etch faster than the sidewall portions, resulting in oxide fences such as that indicated by reference numeral 404.

Figure 5:
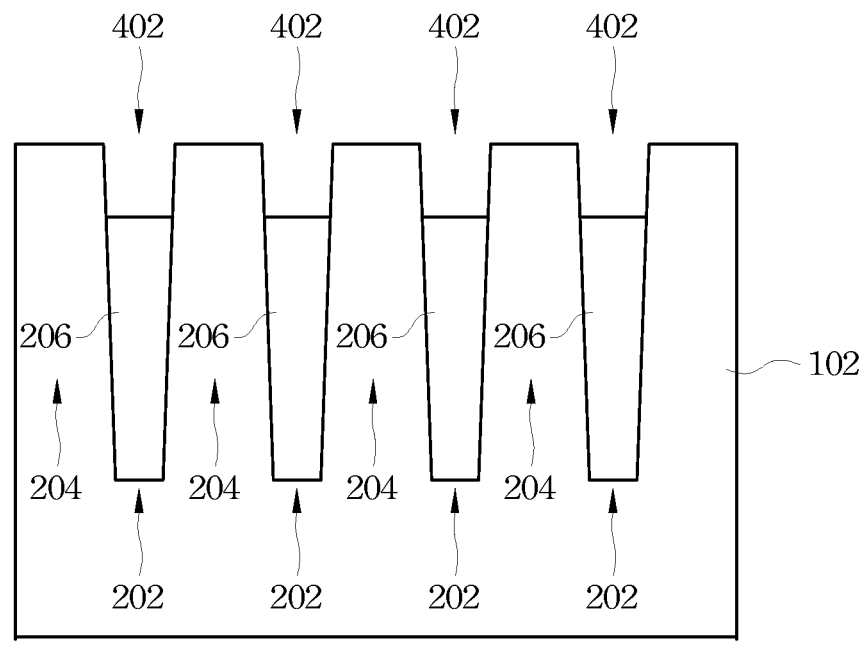

FIG. 5 illustrates a second etch-back process to remove the oxide fences 404 (see FIG. 4) in accordance with an embodiment of the present invention. In an embodiment in which the dielectric material comprises silicon dioxide, the second etch-back process may be a plasma process using $NF_3$ and $NH_3$ as process gases and an inert gas, such as He, Ne, Ar, Kr, Xe and Rn, and combinations thereof as a carrier gas. The process conditions preferably include a temperature of about 30° C., a pressure of between about 5 mtorr and about 20 torr, an RF power of between about 10 W and about 300 W, and a process time of between about 2 seconds and about 600 seconds.

The $NF_3$ and $NH_3$ combine in the form of plasma such that the etchants $NH_4F$ and $NH_4F.HF$ result. These etchants react with the silicon dioxide, creating $(NH_4)_2SiF_6$ (which is a solid) and $H_2O$. The solid material is formed along the bottom of the recesses 402 and acts as a mask to reduce the etching or recessing along the bottom. As a result, the dielectric material along the sidewalls of the trench is etched at a faster rate than the bottom of the recesses 402.

After removing the dielectric material along the sidewalls of the trenches 202, the solid material, e.g., $(NH_4)_2SiF_6$, may be removed by sublimation at a temperature greater than about 100° C. The sublimation results in a $SiF_4$ gas, $NH_3$ gas, and HF gas.

In another embodiment, the oxide fences 404 formed of silicon dioxide may be removed using a polymer-rich gas. For example, a polymer-rich gas such as $CHF_3$, $CH_2F_2$, $CH_3F$, $C_4F_6$, $C_4F_8$, $C_5F_8$, or the like, may be used. The process conditions preferably include a temperature between about 10° C. and about 70° C., a pressure of between about 5 mtorr and about 20 torr, an RF power of between about 10 W and about 300 W, and a process time of between about 2 seconds and about 600 seconds.

During the etching process, a polymer is formed along the bottom of the recesses 402 and acts as a mask to reduce the etching rate along the bottom of the recesses 402. As a result, the dielectric material along the sidewalls of the trench is etched at a faster rate than the dielectric material along the bottom of the recesses. After removing the dielectric material along the sidewalls of the trench, the polymer formed along the bottom of the trench may be removed by sublimation at a temperature greater than about 100° C.

Figure 6:
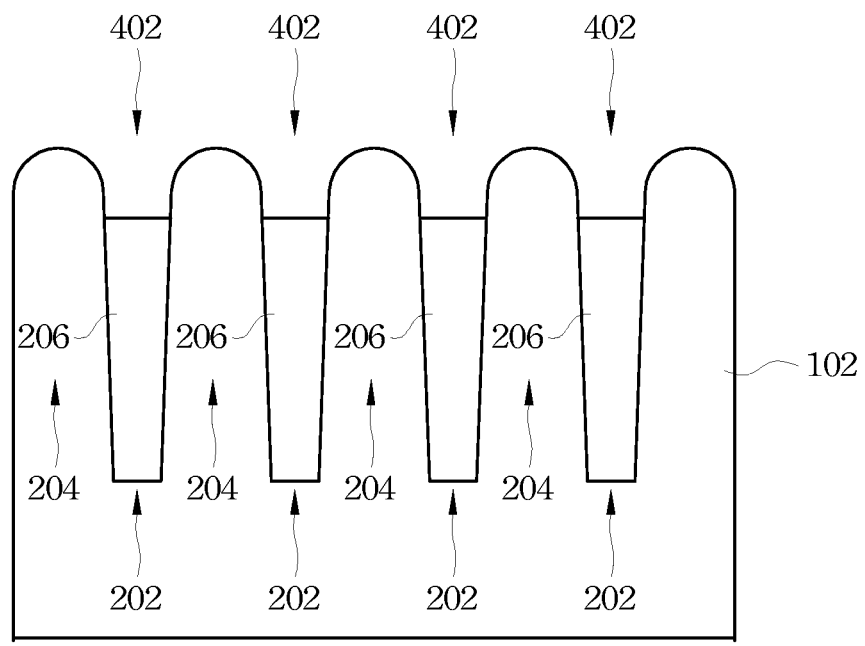
FIG. 6 illustrates another method of forming fins in accordance with an embodiment of the present invention.

FIG. 6 illustrates another embodiment in which the oxide fences 404 (see FIG. 4) may be removed in accordance with an embodiment of the present invention. The process illustrated in FIG. 6 may be performed after processes such as those discussed above with reference to FIGS. 1-4 have been performed, wherein like reference numerals refer to like elements.

In this embodiment, the oxide fences 404 are removed using a process gas of $H_2$ and an inert gas as a carrier gas, such as He, Ne, Ar, Kr, Xe and Rn, and combinations thereof. The process conditions preferably include a temperature of between about 500° C. and about 1100° C., a pressure of between about 2 torr and about 500 torr, and a process time of between about 2 seconds and about 60 minutes.

The $H_2$ reacts with the silicon substrate, which in turn reacts with the silicon dioxide to form an absorbed silicon and water vapor. The absorbed silicon in turn reacts further with the silicon dioxide to form silicon oxide gas. As a result of this process, the silicon dioxide adjacent to the exposed sections of the semiconductor substrate 102 is etched at a faster rate than the silicon dioxide along the bottom of the recesses 402, thereby removing the oxide fences 404. This process also results in the silicon atoms from the substrate being converted to silicon oxide gas by product, and as a result, the corners of the fins may be rounded as illustrated in FIG. 6.

It should be noted that the processes discussed above may also be performed without performing the first etch-back process discussed above with reference to FIG. 4. For example, given the structure as discussed above with reference to FIG. 3, a single etch-back process using a $NF_3$ and $NH_3$ plasma process may be used. As discussed above, the solid $(NH_4)_2SiF_6$ forms and slows the etching process in the vertical direction, thereby allowing the silicon dioxide along the sidewalls (e.g., the ISSG oxide) at a rate comparable to the etch rate in the vertical direction. As noted above, the solid $(NH_4)_2SiF_6$ may be removed by sublimation at a temperature greater than about 100° C.

Similarly, a single etch-back process may be performed using a polymer-rich gas, such as $CHF_3$, $CH_2F_2$, $CH_3F$, $C_4F_6$, $C_4F_8$, $C_5F_8$, or the like, as discussed above. The solid polymer layer formed along the horizontal surface of the dielectric material as the dielectric material is recessed in the vertical direction allows the silicon dioxide along the sidewalls (e.g., the ISSG oxide) to be etched at a rate comparable as the etch rate in the vertical direction. As noted above, the solid polymer layer may be removed by sublimation at a temperature greater than about 100° C.

A single-etch process may also be used to recess the dielectric material using $H_2$ as discussed above with reference to FIG. 6. Using the same mechanism as discussed above, the $H_2$ reacts with the silicon substrate to etch the silicon dioxide of the isolation regions 206 to prevent the formation of the oxide fences 404 (see FIG. 4).

Thereafter, steps may be taken to complete fabrication of the desired device. For example, for forming a finFET device, a gate dielectric may be formed, a gate electrode may be formed, overlying dielectric layers and metallization layers may be formed, and singulation and packaging may be performed.

One of ordinary skill in the art will realize that the removal of the fences will prevent a thinner gate oxide from being formed, thereby reducing the gate leakage and improving the transistor performance.

Although the present invention and its advantages have been described in detail, it should be understood that various changes, substitutions and alterations can be made herein without departing from the spirit and scope of the invention as defined by the appended claims. For example, different types of materials and processes may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
providing a substrate;
forming one or more fins in the substrate, wherein the fins are finFET fins;
completely filling an area between adjacent ones of the fins with a dielectric material, the filling comprising forming the dielectric material using a first method and a second method different from the first method, the dielectric material being the same material throughout the dielectric material; and
recessing the dielectric material below a top surface of the fins, at least a portion of the dielectric material along sidewalls of the fin above a bottom of a recess being substantially removed, thereby exposing at least a portion of the sidewalls of the fins, wherein the recessing comprises performing a first etch to recess the dielectric material such that fences of the dielectric material remain along the sidewalls of the fins and a second etch to remove the fences, the fences comprising a first portion along the sidewalls with a first width and a second portion along the sidewalls with a second width different from the first width.

2. The method of claim 1, wherein the second etch comprises a plasma etch process using $NH_3$ and $NF_3$.

3. The method of claim 1, wherein the second etch comprises an etch process using a polymer-rich gas.

4. The method of claim 3, wherein the polymer-rich gas comprises $CHF_3$, $CH_2F_2$, $CH_3F$, $C_4F_6$, $C_4F_8$, or $C_5F_8$.

5. The method of claim 1, wherein the second etch comprises an $H_2$ etch process.

6. The method of claim 1, wherein the recessing comprises performing a single etch.

7. The method of claim 6, wherein the single etch comprises a plasma etch process using $NH_3$ and $NF_3$.

8. The method of claim 6, wherein the single etch comprises a process using a polymer-rich gas.

9. The method of claim 6, wherein the single etch comprises an $H_2$ etch process.

10. A method of forming a semiconductor device, the method comprising:
providing a substrate;
forming one or more trenches in the substrate, wherein sidewalls of the one or more trenches are only semiconductor material;
completely filling at least one of the one or more trenches with a dielectric material of a single composition type, the dielectric material having a bottom surface extending across the at least one of the one or more trenches;
recessing the dielectric material within the one or more trenches, the recessing leaving fences of the dielectric material along the sidewalls of the one or more trenches while leaving the bottom surface; and removing the fences of the dielectric material along the sidewalls of the one or more trenches such that at least portions of the sidewalls of the one or more trenches are exposed, the removing the fences leaving a portion of the dielectric material within each of the one or more trenches, wherein the portion of the dielectric material left has the bottom surface extending across at least one of the one or more trenches.

11. The method of claim 10, wherein the removing the fences is performed at least in part by a plasma etch process using $NH_3$ and $NF_3$.

12. The method of claim 10, wherein the removing the fences is performed at least in part by an etch process using a polymer-rich gas.

13. The method of claim 12, wherein the polymer-rich gas comprises $CHF_3$, $CH_2F_2$, $CH_3F$, $C_4F_6$, $C_4F_8$, or $C_5F_8$.

14. The method of claim 10, wherein the removing the fences is performed at least in part by an $H_2$ etch process.

15. The method of claim 10, wherein the removing results in a solid formed along a top surface of the dielectric material and further comprises removing the solid by sublimation.

16. A method of forming a semiconductor device, the method comprising:

providing a substrate having a trench formed therein;

filling all of the trench with a dielectric material;

planarizing the dielectric material;

performing a first etching process to recess the dielectric material such that a top surface of the dielectric material is below a top surface of the substrate, the first etching process leaving tapered fences of the dielectric material along sidewalls of the trench, wherein the sidewalls of the trench are only semiconductor material; and performing a second etching process to remove the tapered fences thereby exposing portions of the sidewalls of the trench, wherein after the performing the second etching process the dielectric material extends from a first side of the trench to a second side of the trench.

17. The method of claim 16, wherein the first etching process and the second etching process are a single continuous etch process.

18. The method of claim 16, wherein the second etching process is a deposition-etch process.

19. The method of claim 16, wherein the second etching process comprises a plasma etch process using $NH_3$ and $NF_3$, an etch process using a polymer-rich gas, or an $H_2$ etch process.

20. The method of claim 16, wherein the sidewalls of the trench are part of a finFET.

* * * * *